(12) United States Patent
Ogomi et al.

(10) Patent No.: US 11,061,176 B2
(45) Date of Patent: Jul. 13, 2021

(54) POLARIZER, POLARIZING PLATE, AND IMAGE DISPLAY APPARATUS

(71) Applicant: NITTO DENKO CORPORATION, Ibaraki (JP)

(72) Inventors: Daisuke Ogomi, Ibaraki (JP); Yuji Saiki, Ibaraki (JP); Masahiro Yaegashi, Ibaraki (JP); Kota Nakai, Ibaraki (JP); Yuki Nakano, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 16/801,670

(22) Filed: Feb. 26, 2020

(65) Prior Publication Data
US 2020/0225395 A1 Jul. 16, 2020

Related U.S. Application Data

(62) Division of application No. 15/306,362, filed as application No. PCT/JP2015/062358 on Apr. 23, 2015, now abandoned.

(30) Foreign Application Priority Data

Apr. 25, 2014 (JP) ................. 2014-091842
Apr. 22, 2015 (JP) ................. 2015-087686

(51) Int. Cl.
*G02B 5/30* (2006.01)
*G02F 1/1335* (2006.01)
*H01L 51/52* (2006.01)

(52) U.S. Cl.
CPC .......... *G02B 5/3025* (2013.01); *G02B 5/3033* (2013.01); *G02F 1/133528* (2013.01); *H01L 51/5281* (2013.01)

(58) Field of Classification Search
CPC ...... G02B 5/30; G02B 5/3025; G02B 5/3033; G02B 5/3041; G02B 5/305; G02B 1/08;
(Continued)

(56) References Cited

U.S. PATENT DOCUMENTS 2,409,923 A  10/1946 Barnes
2,647,440 A   8/1953 Rehorn
(Continued)

FOREIGN PATENT DOCUMENTS

CN  101569205 A  10/2009
CN  102331635 A   1/2012
(Continued)

OTHER PUBLICATIONS

Anderson et al., Interaction of Concentration and Temperature of Acetic Acid Solution on Reduction of Various Species of Microorganisms on Beef Surfaces. Journal of Food Protection, vol. 52, No. 5, pp. 312-315, May 1989 (Year: 1989).*
(Continued)

*Primary Examiner* — Stephone B Allen
*Assistant Examiner* — Adam W Booher
(74) *Attorney, Agent, or Firm* — Westerman, Hattori, Daniels & Adrian, LLP (57) ABSTRACT

A polarizer that can realize the multi-functionalization and high-functionalization of an electronic device, such as an image display apparatus. A polarizer including a resin film containing a dichroic substance, wherein the polarizer has a low dichroic substance concentration portion whose content of the dichroic substance is relatively low in the resin film. In the polarizer, the low dichroic substance concentration portion has a content of an alkali metal and/or an alkaline earth metal of 3.6 wt % or less.

8 Claims, 3 Drawing Sheets

(58) Field of Classification Search
CPC ..... G02B 1/12; G02B 27/28; G02F 1/133528; G02F 1/133538; G02F 1/133543; H01L 51/5281; H01L 51/5293
See application file for complete search history.

(56) References Cited

U.S. PATENT DOCUMENTS

| | | | |
|---|---|---|---|
| 4,181,756 A | 1/1980 | Fergason | |
| 4,396,646 A | 8/1983 | Schuler et al. | |
| 4,466,704 A | 8/1984 | Schuler et al. | |
| 5,327,285 A | 7/1994 | Faris | |
| 5,374,477 A | 12/1994 | Lawless et al. | |
| 5,430,566 A | 7/1995 | Sakaya et al. | |
| 5,593,771 A | 1/1997 | Lawless et al. | |
| 5,926,310 A | 7/1999 | Tamura et al. | |
| 6,072,566 A | 6/2000 | Fujii et al. | |
| 6,188,451 B1 | 2/2001 | Fujii et al. | |
| 6,258,429 B1 | 7/2001 | Nelson | |
| 6,590,605 B1 | 7/2003 | Eichenlaub | |
| 6,606,136 B2 | 8/2003 | Matsumoto et al. | |
| 6,757,102 B2 | 6/2004 | Nishida et al. | |
| 8,101,884 B2 | 1/2012 | Kato et al. | |
| 8,130,293 B2 | 3/2012 | Kanamori et al. | |
| 8,248,558 B2 | 8/2012 | Kimura et al. | |
| 8,259,263 B2 | 9/2012 | Kimura et al. | |
| 8,277,587 B2 | 10/2012 | Kimura et al. | |
| 8,314,987 B2 | 11/2012 | Goto et al. | |
| 8,320,042 B2 | 11/2012 | Goto et al. | |
| 8,379,169 B2 | 2/2013 | Kitagawa et al. | |
| 8,404,334 B2 | 3/2013 | Kimura et al. | |
| 8,411,360 B2 | 4/2013 | Kitagawa et al. | |
| 8,467,177 B2 | 6/2013 | Mathew et al. | |
| 8,491,737 B2 | 7/2013 | Kimura et al. | |
| 8,520,169 B2 | 8/2013 | Kitagawa et al. | |
| 8,520,171 B2 | 8/2013 | Kitagawa et al. | |
| 8,657,976 B2 | 2/2014 | Kimura et al. | |
| 8,709,567 B2 | 4/2014 | Kitagawa et al. | |
| 8,721,816 B2 | 5/2014 | Kitagawa et al. | |
| 8,771,454 B2 | 7/2014 | Goto et al. | |
| 8,852,374 B2 | 10/2014 | Goto et al. | |
| 9,023,168 B2 | 5/2015 | Kitagawa et al. | |
| 9,039,861 B2 | 5/2015 | Yasui et al. | |
| 9,143,668 B2 | 9/2015 | Mathew et al. | |
| 9,169,423 B2 | 10/2015 | Yasui et al. | |
| 9,244,307 B2 | 1/2016 | Hada et al. | |
| 9,283,740 B2 | 3/2016 | Kitagawa et al. | |
| 9,291,744 B2 | 3/2016 | Sawada et al. | |
| 9,329,307 B2 | 5/2016 | Sawada et al. | |
| 9,372,505 B2 | 6/2016 | Mathew et al. | |
| 9,381,534 B2 | 7/2016 | Kim et al. | |
| 9,442,234 B2 | 9/2016 | Kitagawa et al. | |
| 9,442,235 B2 | 9/2016 | Kitagawa et al. | |
| 9,459,390 B2 | 10/2016 | Kitagawa et al. | |
| 9,488,756 B2 | 11/2016 | Yasui et al. | |
| 9,557,450 B2 | 1/2017 | Yasui et al. | |
| 9,618,668 B2 | 4/2017 | Kitagawa et al. | |
| 9,744,750 B2 | 8/2017 | Kitagawa et al. | |
| 9,925,553 B2 | 3/2018 | Kim et al. | |
| 10,009,525 B2 | 6/2018 | Mathew et al. | |
| 10,228,496 B2 | 3/2019 | Yasui et al. | |
| 10,359,553 B2 | 7/2019 | Lee et al. | |
| 10,421,264 B2 | 9/2019 | Kitagawa et al. | |
| 10,429,560 B2 | 10/2019 | Lee et al. | |
| 10,436,960 B2 | 10/2019 | Lee et al. | |
| 10,436,962 B2 | 10/2019 | Lee et al. | |
| 2002/0071179 A1 | 6/2002 | Maeda et al. | |
| 2004/0212555 A1 | 10/2004 | Falco | |
| 2006/0222813 A1 | 10/2006 | Kato et al. | |
| 2007/0224416 A1 | 9/2007 | Matsubayashi et al. | |
| 2008/0192345 A1 | 8/2008 | Mochizuki et al. | |
| 2009/0136712 A1 | 5/2009 | Sato | |
| 2009/0278954 A1 | 11/2009 | Kanamori et al. | |
| 2010/0032088 A1 | 2/2010 | Kato et al. | |
| 2010/0283943 A1 | 11/2010 | Kimura et al. | |
| 2010/0288420 A1 | 11/2010 | Kimura et al. | |
| 2010/0316817 A1 | 12/2010 | Kimura et al. | |
| 2012/0052197 A1 | 3/2012 | Sawada et al. | |
| 2012/0055607 A1 | 3/2012 | Kitagawa et al. | |
| 2012/0055608 A1 | 3/2012 | Kitagawa et al. | |
| 2012/0055621 A1 | 3/2012 | Goto et al. | |
| 2012/0055622 A1 | 3/2012 | Kitagawa et al. | |
| 2012/0055623 A1 | 3/2012 | Kitagawa et al. | |
| 2012/0056211 A1 | 3/2012 | Kitagawa et al. | |
| 2012/0056340 A1 | 3/2012 | Kitagawa et al. | |
| 2012/0057104 A1 | 3/2012 | Kitagawa et al. | |
| 2012/0057107 A1 | 3/2012 | Kitagawa et al. | |
| 2012/0057231 A1 | 3/2012 | Goto et al. | |
| 2012/0057232 A1 | 3/2012 | Goto et al. | |
| 2012/0058291 A1 | 3/2012 | Kitagawa et al. | |
| 2012/0058321 A1 | 3/2012 | Goto et al. | |
| 2012/0105400 A1 | 5/2012 | Mathew et al. | |
| 2012/0106063 A1 | 5/2012 | Mathew et al. | |
| 2012/0160420 A1 | 6/2012 | Kimura et al. | |
| 2012/0180930 A1 | 7/2012 | Kimura et al. | |
| 2012/0206641 A1 | 8/2012 | Baba | |
| 2012/0211167 A1 | 8/2012 | Kimura et al. | |
| 2012/0216937 A1 | 8/2012 | Kimura et al. | |
| 2012/0300299 A1 | 11/2012 | Yasui et al. | |
| 2013/0017363 A1 | 1/2013 | Morioka et al. | |
| 2013/0100529 A1 | 4/2013 | Kitagawa et al. | |
| 2013/0114139 A1 | 5/2013 | Kitagawa et al. | |
| 2013/0141787 A1 | 6/2013 | Kim et al. | |
| 2013/0160938 A1 | 6/2013 | Yasui et al. | |
| 2013/0216805 A1 | 8/2013 | Yasui et al. | |
| 2013/0265708 A1 | 10/2013 | Mathew et al. | |
| 2014/0016198 A1 | 1/2014 | Sawada et al. | |
| 2014/0044947 A1 | 2/2014 | Sawada et al. | |
| 2014/0118826 A1 | 5/2014 | Jiao et al. | |
| 2014/0130955 A1 | 5/2014 | Yasui et al. | |
| 2014/0186568 A1 | 7/2014 | Kitagawa et al. | |
| 2014/0342129 A1 | 11/2014 | Kim et al. | |
| 2014/0378020 A1 | 12/2014 | Hada et al. | |
| 2015/0158046 A1 | 6/2015 | Kim et al. | |
| 2015/0160390 A1 | 6/2015 | Goyal et al. | |
| 2015/0183199 A1 | 7/2015 | Kitagawa et al. | |
| 2015/0219797 A1 | 8/2015 | Goto et al. | |
| 2016/0025910 A1 | 1/2016 | Sawada et al. | |
| 2016/0054494 A1 | 2/2016 | Kitagawa et al. | |
| 2016/0103258 A1 | 4/2016 | Kitagawa et al. | |
| 2016/0195644 A1 | 7/2016 | Yasui et al. | |
| 2016/0195645 A1 | 7/2016 | Yasui et al. | |
| 2016/0195653 A1 | 7/2016 | Lee et al. | |
| 2016/0195767 A1 | 7/2016 | Lee et al. | |
| 2016/0202403 A1 | 7/2016 | Mathew et al. | |
| 2016/0212311 A1 | 7/2016 | Mathew et al. | |
| 2016/0299271 A1 | 10/2016 | Lee et al. | |
| 2016/0299272 A1 | 10/2016 | Lee et al. | |
| 2016/0313480 A1 | 10/2016 | Lee et al. | |
| 2016/0377777 A1 | 12/2016 | Lee et al. | |
| 2017/0045656 A1 | 2/2017 | Ogomi et al. | |
| 2017/0045657 A1 | 2/2017 | Ogomi et al. | |
| 2017/0052299 A1 | 2/2017 | Ogomi et al. | |
| 2017/0090086 A1 | 3/2017 | Goto et al. | |
| 2017/0090087 A1 | 3/2017 | Goto et al. | |
| 2017/0129197 A1 | 5/2017 | Yaegashi et al. | |
| 2017/0131448 A1 | 5/2017 | Lee et al. | |
| 2017/0131449 A1 | 5/2017 | Yaegashi et al. | |
| 2017/0131451 A1 | 5/2017 | Yaegashi et al. | |
| 2017/0254939 A1 | 9/2017 | Lee et al. | |
| 2018/0188421 A1 | 7/2018 | Yasui et al. | |

FOREIGN PATENT DOCUMENTS

| | | |
|---|---|---|
| CN | 102609038 A | 7/2012 |
| CN | 202394154 U | 8/2012 |
| CN | 105229506 A | 1/2016 |
| CN | 105247395 A | 1/2016 |
| JP | S48-038160 A | 6/1973 |
| JP | S48-064941 A | 9/1973 |
| JP | 58-49901 A | 3/1983 |
| JP | S58-49901 A | 3/1983 |
| JP | 58-168018 A | 10/1983 |
| JP | 58-168019 A | 10/1983 |
| JP | S58-168020 A | 10/1983 |

(56) References Cited

FOREIGN PATENT DOCUMENTS

| | | |
|---|---|---|
| JP | 59-58419 A | 4/1984 |
| JP | S59-058419 A | 4/1984 |
| JP | 59-172610 A | 9/1984 |
| JP | S59-172610 A | 9/1984 |
| JP | 60-133401 A | 7/1985 |
| JP | H07-000770 B2 | 1/1995 |
| JP | H08-506867 A | 7/1996 |
| JP | H09-241594 A | 9/1997 |
| JP | H10-90675 A | 4/1998 |
| JP | H10-183390 A | 7/1998 |
| JP | 11-52130 A | 2/1999 |
| JP | H11-52130 A | 2/1999 |
| JP | 2001-075048 A | 3/2001 |
| JP | 2003-207608 A | 7/2003 |
| JP | 2004-054031 A | 2/2004 |
| JP | 2005-089782 A | 4/2005 |
| JP | 2005-089783 A | 4/2005 |
| JP | 2005-326249 A | 11/2005 |
| JP | 2005-336249 A | 12/2005 |
| JP | 2006-308923 A | 11/2006 |
| JP | 2006-308938 A | 11/2006 |
| JP | 2007-070440 A | 3/2007 |
| JP | 2007-241314 A | 9/2007 |
| JP | 2008-102246 A | 5/2008 |
| JP | 2008-102274 A | 5/2008 |
| JP | 2009-130317 A | 6/2009 |
| JP | 101925846 A | 12/2010 |
| JP | 2011-081315 A | 4/2011 |
| JP | 2011-81315 A | 4/2011 |
| JP | 2012-073563 A | 4/2012 |
| JP | 2012-073574 A | 4/2012 |
| JP | 2012-98726 A | 5/2012 |
| JP | 2012-133308 A | 7/2012 |
| JP | 2012-137738 A | 7/2012 |
| JP | 102609038 A | 7/2012 |
| JP | 2013/65995 A | 4/2013 |
| JP | 2013-065995 A | 4/2013 |
| JP | 2013-65995 A | 4/2013 |
| JP | 2013-137738 A | 7/2013 |
| JP | 2013-218319 A | 10/2013 |
| JP | 2014-081482 A | 5/2014 |
| JP | 2014081482 A | 5/2014 |
| JP | 2014-164085 A | 9/2014 |
| JP | 2014-167548 A | 9/2014 |
| JP | 2014-211548 A | 11/2014 |
| JP | 2015-215609 A | 12/2015 |
| JP | 2016-525725 A | 8/2016 |
| JP | 2016538599 A | 12/2016 |
| JP | 2017-500606 A | 1/2017 |
| JP | 2017-503193 A | 1/2017 |
| KR | 20050070688 A | 7/2005 |
| KR | 20050085865 A | 8/2005 |
| KR | 10-2009-0107648 A | 10/2009 |
| KR | 10-2009-0129947 A | 12/2009 |
| KR | 20090132406 A | 12/2009 |
| KR | 10-2010-0087837 A | 8/2010 |
| KR | 2010-0087837 A | 8/2010 |
| KR | 10-2010-0125537 A | 12/2010 |
| KR | 10-2010-0125558 A | 12/2010 |
| KR | 2010-0125558 A | 12/2010 |
| KR | 10-2011-0105803 A | 9/2011 |
| KR | 10-2011-0110889 A | 10/2011 |
| KR | 2011-0110889 A | 10/2011 |
| KR | 2012-0046035 A | 5/2012 |
| KR | 10-2012-0118205 A | 10/2012 |
| KR | 10-2013-0012026 A | 1/2013 |
| KR | 2013-0019001 A | 2/2013 |
| KR | 10-2013-0056323 A | 5/2013 |
| KR | 10-1293210 B1 | 8/2013 |
| KR | 101293210 B1 | 8/2013 |
| KR | 10-2013-0098914 A | 9/2013 |
| KR | 10-2014-0009035 A | 1/2014 |
| KR | 10-2015-0058450 A | 5/2015 |
| KR | 10-2015-0086159 A | 7/2015 |
| KR | 10-2015-0111871 A | 10/2015 |
| KR | 10-2015-0111878 A | 10/2015 |
| KR | 10-2015-0111879 A | 10/2015 |
| KR | 10-2016-0089349 A | 7/2016 |
| KR | 10-1706863 B1 | 2/2017 |
| TW | 200420705 A | 10/2004 |
| TW | 200949321 A | 12/2009 |
| TW | 201028436 A | 8/2010 |
| TW | I333502 B | 11/2010 |
| TW | 201219914 A | 5/2012 |
| TW | 201224716 A1 | 6/2012 |
| TW | 201307512 A | 2/2013 |
| TW | 201329535 A | 7/2013 |
| TW | 201530199 A | 8/2015 |
| TW | 201602653 A | 1/2016 |
| WO | 2006/095815 A1 | 9/2006 |
| WO | 2008/155873 A1 | 12/2008 |
| WO | 2009/128122 A1 | 10/2009 |
| WO | 2014/065140 A1 | 5/2014 |
| WO | 2015/046969 A1 | 4/2015 |
| WO | 2015/108261 A1 | 7/2015 |
| WO | 2015/147551 A1 | 10/2015 |
| WO | 2015/147552 A1 | 10/2015 |
| WO | 2016/003105 A1 | 1/2016 |

OTHER PUBLICATIONS

Non Final Office Action dated Apr. 5, 2018. Issued in U.S. Appl. No. 15/306,390.
Final Office Action dated Oct. 18, 2018. Issued in U.S. Appl. No. 15/306,390.
Non Final Office Action dated May 16, 2019. Issued in U.S. Appl. No. 15/306,390.
Final Office Action dated Oct. 22, 2019. Issued in U.S. Appl. No. 15/306,390.
Non Final Office Action dated Oct. 20, 2017. Issued in U.S. Appl. No. 15/306,362.
Final Office Action dated May 18, 2018. Issued in U.S. Appl. No. 15/306,362.
Non Final Office Action dated Nov. 1, 2018. Issued in U.S. Appl. No. 15/306,362.
Final Office Action dated May 2, 2019. Issued in U.S. Appl. No. 15/306,362.
Non Final Office Action dated Oct. 3, 2019. Issued in U.S. Appl. No. 15/306,362.
Non Final Office Action dated May 31, 2018. Issued in U.S. Appl. No. 15/306,316.
Final Office Action dated Oct. 24, 2018. Issued in U.S. Appl. No. 15/306,316.
Non Final Office Action dated Nov. 15, 2017. Issued in U.S. Appl. No. 15/321,974.
Non Final Office Action dated Jun. 1, 2017. Issued in U.S. Appl. No. 15/322,258.
Final Office Action dated Nov. 2, 2017. Issued in U.S. Appl. No. 15/322,258.
Non Final Office Action dated May 31, 2018. Issued in U.S. Appl. No. 15/322,258.
Non Final Office Action dated Dec. 27, 2018. Issued in U.S. Appl. No. 15/322,258.
Non Final Office Action dated May 17, 2018. Issued in U.S. Appl. No. 15/321,875.
Non Final Office Action dated Sep. 11, 2018. Issued in U.S. Appl. No. 15/322,310.
Final Office Action dated Jan. 11, 2019. Issued in U.S. Appl. No. 15/322,310.
Non Final Office Action dated May 31, 2019. Issued in U.S. Appl. No. 15/322,310.
Non Final Office Action dated Sep. 13, 2017. Issued in U.S. Appl. No. 15/271,891.
Non Final Office Action dated Apr. 16, 2018. Issued in U.S. Appl. No. 15/271,891.
Non Final Office Action dated Apr. 20, 2018. Issued in U.S. Appl. No. 15/279,949.
Final Office Action dated Oct. 10, 2018. Issued in U.S. Appl. No. 15/271,949.

(56) References Cited

OTHER PUBLICATIONS

Non Final Office Action dated Feb. 27, 2019. Issued in U.S. Appl. No. 15/271,949.
Non Final Office Action dated Jul. 10, 2019. Issued in U.S. Appl. No. 15/271,949.
Non Final Office Action dated Sep. 7, 2017. Issued in U.S. Appl. No. 15/271,973.
Non Final Office Action dated Mar. 30, 2018. Issued in U.S. Appl. No. 15/271,973.
Non Final Office Action dated Jul. 30, 2018. Issued in U.S. Appl. No. 15/271,973.
Non Final Office Action dated Dec. 11, 2018. Issued in U.S. Appl. No. 15/271,973.
Non Final Office Action dated Nov. 27, 2019. Issued in U.S. Appl. No. 15/271,973.
Office Action dated Jun. 23, 2020, issued in KR application No. 10-2017-7011899(counterpart to U.S. Appl. No. 15/306,390), with English translation. (8 pages).
Search Report dated Jun. 9 2015, issued in counterpart International Application No. PCT/JP2015/062358.
Office Action dated Jan. 17, 2017 issued in Korean Patent Application No. 10-2015-7036599 with English translation.
Office Action dated Jan. 17, 2017 issued in Korean Patent Application No. 10-2015-7036600 with English translation.
International Search Report dated Jul. 7, 2015, issued in counterpart International Application No. PCT/JP2015/062359.
Office Action dated Mar. 8, 2017, issued in Japanese Patent Application No. 2015-087685, with English translation.
Office Action dated Mar. 8, 2017, issued in Japanese Patent Application No. 2015-087686, with English translation.
Office Action dated Mar. 8, 2017, issued in Japanese Patent Application No. 2015-087687, with English translation.
International Search Report dated Aug. 11, 2015, issued in counterpart International Application No. PCT/JP2015/068504.
Office Action dated Jan. 17, 2017 issued in Korean Patent Application No. 10-2015-7036688 with Englsih translation.
International Search Report dated Aug. 11, 2015, issued in counterpart International Application No. PCT/JP2015/068503.
Korean Report on Prior Art Search issued in Korean Patent Application No. 10-2015-7036634 with English translation.
Office Action dated Mar. 9, 2017 issued in Japanese Patent Application No. 2015-127641 with English translation.
Office Action dated Mar. 9, 2017 issued in Japanese Patent Application No. 2015-127642 with English translation.
Office Action dated Mar. 9, 2017 issued in Japanese Patent Application No. 2015-127644 with English translation.
International Search Report dated Aug. 11, 2015, issued in counterpart International Application No. PCT/JP2015/068501.
International Search Report dated Aug. 11, 2015, issued in counterpart International Application No. PCT/JP2015/068502.
Written Opinion dated Nov. 8, 2015, issued in PCT/JP2015/068502.
Written Opinion dated Nov. 8, 2015, issued in PCT/JP2015/068504.
Office Action dated Dec. 6, 2017, issued in Korean Patent Application No. 10-2015-7036599 with translation.
Explanation of Circumstances Concerning Accelerated Examination filed on Nov. 21, 2017 issued in Japanese patent application No. 2015-190040 with translation.
Explanation of Circumstances Concerning Accelerated Examination filed on Nov. 21, 2017 issued in Japanese patent application No. 2015-190081 with translation.
Explanation of Circumstances Concerning Accelerated Examination filed on Nov. 21, 2017 issued in Japanese patent application No. 2015-190128 with translation.
Office Action dated Jan. 24, 2018, issued in Japanese application No. JP2015-190040, with translation.
Office Action dated Jan. 24, 2018, issued in Japanese application No. JP2015-190081, with translation.
Office Action dated Jan. 24, 2018, issued in Japanese application No. JP2015-190128, with translation.
Office Action dated Jul. 2, 2018, issued in Chinese application No. 201580035132.0, with English translation (corresponds to U.S. Appl. No. 15/321,875).
Office Action dated Jul. 2, 2018, issued in Chinese application No. 201580022128.0, with English translation (corresponds to U.S. Appl. No. 15/306,390).
Office Action dated May 30, 2018, issued in Japanese Patent Application No. 2015-190081 with English translation (Corresponds to U.S. Appl. No. 15/271,949).
Office Action dated May 30, 2018, issued in Japanese Patent Application No. 2015-190040 with English translation (Corresponds to U.S. Appl. No. 15/271,891).
Third Party Observation dated Jul. 30, 2018, issued in counterpart Japanese application No. 2015-127643, with English translation.
Office Action dated Aug. 3, 2018, issued in Chinese application No. 201580022170.2 (Counterpart of U.S. Appl. No. 15/306,316) with English translation.
Office Action dated Aug. 20, 2018, issued in counterpart Taiwanese application No. 104113355 (Counterpart of U.S. Appl. No. 15/306,316), with English translation.
Third Party Observation dated Sep. 3, 2018, issued in counterpart application No. 2015-190081(Counterpart of U.S. Appl. No. 15/271,949), with English translation.
Third Observation dated Aug. 28, 2018, issued in counterpart application No. 2015-190040, (Counterpart of U.S. Appl. No. 15/271,891), with English translation.
Office Action dated Aug. 23, 2018, issued in counterpart Taiwanese application No. 104120925 (counterpart to U.S. Appl. No. 15/322,310), with English translation.
Office Action dated Sep. 28, 2018, issued in Taiwanese application No. 104120928(counterpart to U.S. Appl. No. 15/322,258), with English translation.
Office Action dated Oct. 19, 2018, issued in Taiwanese application No. 104113350 (counterpart to U.S. Appl. No. 15/306,362), with English translation.
Office Action dated Oct. 19, 2018, issued in counterpart Taiwanese Application No. 104113350, with English translation.
Office Action dated Sep. 28, 2018, issued in Taiwanese Patent Application No. 104120928 with English translation.
Office Action dated Oct. 19, 2018, issued in Taiwanese Patent Application No. 104113350 with English translation.
Third Party Observation discovered Nov. 30, 2018, submitted to the Korean Patent Office on Aug. 23, 2018 for Korean application No. 10-2018-7003521, with English translation (counterpart to U.S. Appl. No. 15/306,390).
Office Action dated Dec. 18, 2018, issued in counterpart Taiwanese application No. 104120918 (counterpart to U.S. Appl. No. 15/321,875).
Office Action dated Apr. 8, 2019, issued in KR application No. 10-2016-0124048 (counterpart to U.S. Appl. No. 15/271,973), with English translation.
Office Action dated May 10, 2019, issued in TW application No. 104113359 (counterpart to U.S. Appl. No. 15/306,390), with English translation.
Office Action dated Mar. 20, 2020, issued in TW application No. 105128571 (counterpart to U.S. Appl. No. 15/271,973), with English translation. (14 pages).
Non-Final Office Action dated May 12, 2020, issued in U.S. Appl. No. 15/739,531. (10 pages).
Non-Final Office Action dated May 28, 2020, issued in U.S. Appl. No. 15/271,973. (20 pages).
International Search Report dated Sep. 20, 2016, issued in counterpart International Application No. PCT/JP2016/068134. (2 pages).
Third Party Observation dated Jul. 23, 2018, issued in JP Application No. 2015-127717 (counterpart to U.S. Appl. No. 15/739,531), with English translation. (12 pages).
Third Party Observation dated Jul. 18, 2018, issued in KR Application No. 10-2017-7036920 (counterpart to U.S. Appl. No. 15/739,531), with English translation. (22 pages).
Office Action dated Oct. 22, 2018, issued in KR Application No. 10-2017-7036920 (counterpart to U.S. Appl. No. 15/739,531), with English translation. (12 pages).

(56) References Cited

OTHER PUBLICATIONS

Office Action dated Aug. 2, 2019, issued in CN Application No. 201680037305.7 (counterpart to U.S. Appl. No. 15/739,531), with English translation. (17 pages).
Office Action dated Oct. 29, 2019, issued in TW Application No. 105119990 (counterpart to U.S. Appl. No. 15/739,531), with English translation. (17 pages).
Non-Final Office Action dated Sep. 20, 2019, issued in U.S. Appl. No. 15/739,531. (22 pages).
Third-Party Submission under 37 CFR 1.290, dated Sep. 16, 2019. (2 pages).
Office Action dated Jul. 6, 2020, issued in CN application No. 201580022170.2, with English translation (Counterpart to U.S. Appl. No. 15/306,316). (21 pages).
Non-Final dated Nov. 19, 2020, issued in U.S. Appl. No. 15/271,973 (15 pages).
Final dated Nov. 19, 2020, issued in U.S. Appl. No. 15/739,531 (103 pages).

* cited by examiner

POLARIZER, POLARIZING PLATE, AND IMAGE DISPLAY APPARATUS

CROSS-REFERENCE TO RELATED APPLICATION

The application is a Divisional of U.S. patent application Ser. No. 15/306,362, filed on Oct. 24, 2016, which is a national stage application based on PCT/JP2015/062358 which is based on Japanese priority application No. 2015-087686 filed on Apr. 22, 2015 and No. 2014-091842 filed on Apr. 25, 2014, the entire contents of which are hereby incorporated by reference.

TECHNICAL FIELD

The present invention relates to a polarizer, a polarizing plate, and an image display apparatus. More specifically, the present invention relates to a polarizer having a non-polarizing portion, and a polarizing plate and an image display apparatus each using such polarizer.

BACKGROUND ART

Some of the image display apparatus of a cellular phone, a notebook personal computer (PC), and the like have mounted thereon internal electronic parts, such as a camera. Various investigations have been made for the purpose of improving, for example, the camera performance of any such image display apparatus (for example, Patent Literatures 1 to 5). However, an additional improvement in camera performance or the like has been desired in association with rapid widespread use of a smart phone and a touch panel-type information processing apparatus. In addition, a polarizing plate partially having polarization performance has been required in order to correspond to the diversification of the shapes of the image display apparatus and the high-functionalization thereof.

CITATION LIST

Patent Literature

[PTL 1] JP 2011-81315 A
[PTL 2] JP 2007-241314 A
[PTL 3] US 2004/0212555 A1
[PTL 4] JP 2012-137738 A
[PTL 5] KR 10-2012-0118205 A

SUMMARY OF INVENTION

Technical Problem

The present invention has been made to solve the above-mentioned problems of the related art, and a primary object of the present invention is to provide a polarizer that can realize the multi-functionalization and high-functionalization of an electronic device, such as an image display apparatus.

Solution to Problem

A polarizer according to an embodiment of the present invention includes a resin film containing a dichroic substance, the polarizer having, in the resin film, a low dichroic substance concentration portion whose content of the dichroic substance is relatively low. In the polarizer, the low dichroic substance concentration portion has a content of an alkali metal and/or an alkaline earth metal of 3.6 wt % or less.

In one embodiment of the present invention, the low dichroic substance concentration portion is formed by bringing a basic solution into contact with the resin film.

In one embodiment of the present invention, the basic solution comprises an aqueous solution containing a hydroxide of the alkali metal and/or the alkaline earth metal.

In one embodiment of the present invention, the low dichroic substance concentration portion has a dichroic substance content of 1.0 wt % or less.

In one embodiment of the present invention, the low dichroic substance concentration portion has a transmittance of 50% or more.

In one embodiment of the present invention, the polarizer has a thickness of 30 µm or less.

In one embodiment of the present invention, the low dichroic substance concentration portion corresponds to a camera portion of an image display apparatus on which the polarizer is mounted.

According to another aspect of the present invention, there is provided a polarizing plate. The polarizing plate includes the above described polarizer.

According to still another aspect of the present invention, there is provided an image display apparatus. The image display apparatus includes the above described polarizing plate.

Advantageous Effects of Invention

According to the present invention, there can be provided the polarizer that can achieve the multi-functionalization and high-functionalization of an electronic device. The polarizer of the present invention has a low dichroic substance concentration portion having a content of the dichroic substance relatively lower than that of another portion of the resin film. When the content of the dichroic substance is relatively lower than that of another portion, the transmittance of the low concentration portion can increase. Further, the polarizer of the present invention is excellent in dimensional stability (e.g., dimensional stability under a humidified environment) of the low concentration portion. The polarizer of the present invention can be suitably used in an electronic device. For example, when the low concentration portion corresponds to the camera portion of an image display apparatus, the polarizer can secure a transmission property, and moreover, the polarizer can optimize brightness and a tint at the time of photographing, and prevent the distortion of an image to contribute to an improvement in camera performance. Further, the polarizer of the present invention can be suitably used not only in a reception-type electronic device, such as video apparatus or monitor, but also in a transmission-type electronic device, such as an LED light source or an infrared sensor, and an image display apparatus that secures a transmission property to a naked eye and the straightness of light.

BRIEF DESCRIPTION OF DRAWINGS

FIG. 3 A is an observation photograph for illustrating the transparent portion of the polarizing plate of Comparative Example 2 before a humidity test, and FIG. 3 B is an observation photograph for illustrating the transparent portion of the polarizing plate of Comparative Example 2 after the humidity test.

DESCRIPTION OF EMBODIMENTS

Embodiments of the present invention are described below. However, the present invention is not limited to these embodiments.

A. Polarizer

Figure 1:
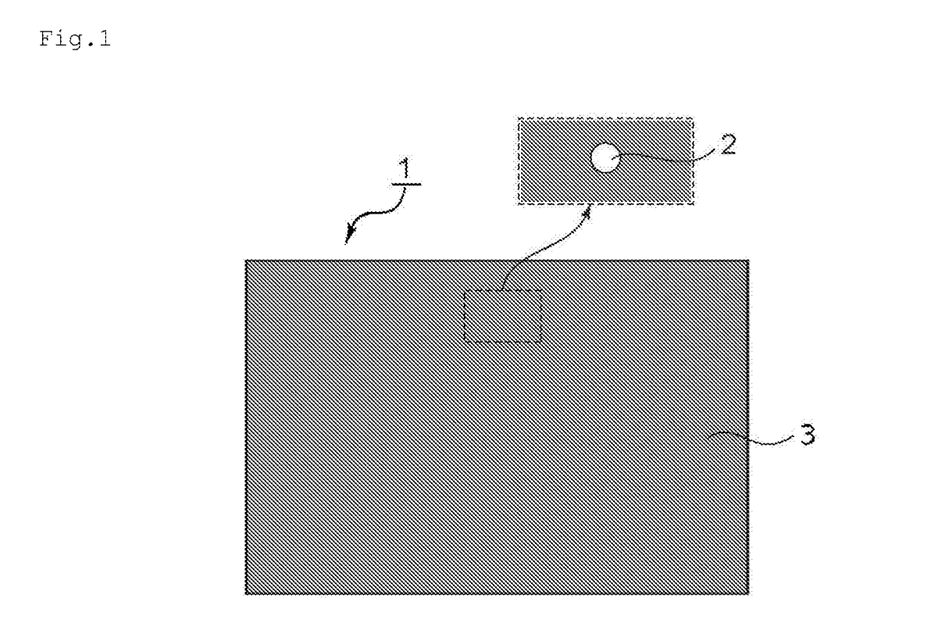
FIG. 1 is a plan view of a polarizer according to one embodiment of the present invention.
Figure 2A:
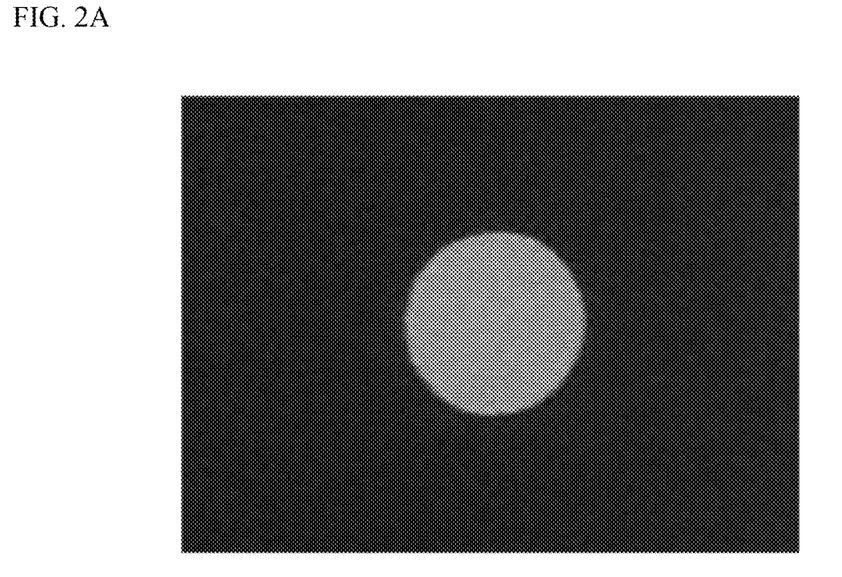
FIG. 2A is an observation photograph for illustrating the transparent portion of the polarizing plate of Example 1 before a humidity test.
Figure 2B:
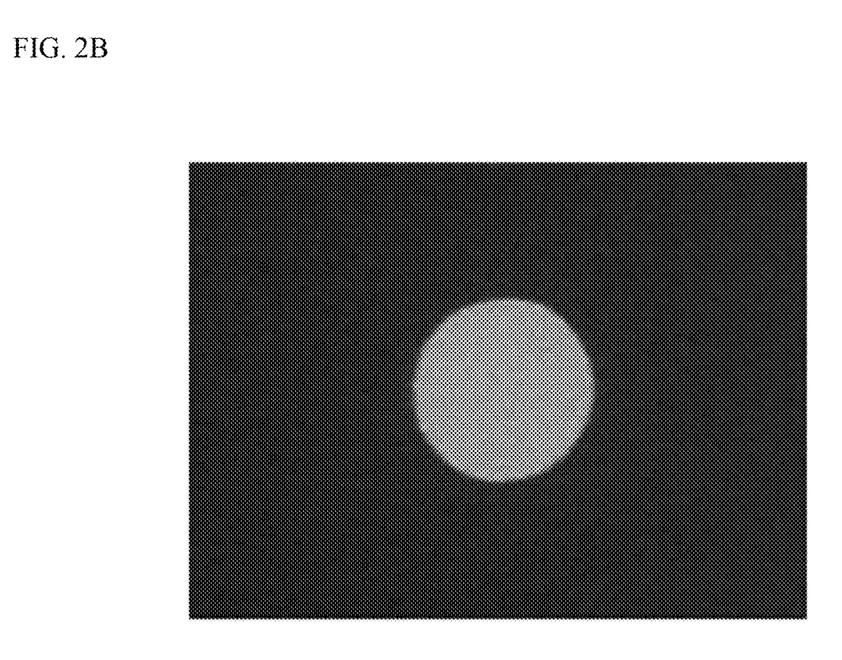
FIG. 2B is an observation photograph for illustrating the transparent portion of the polarizing plate of Example 1 after the humidity test.
Figure 3A:
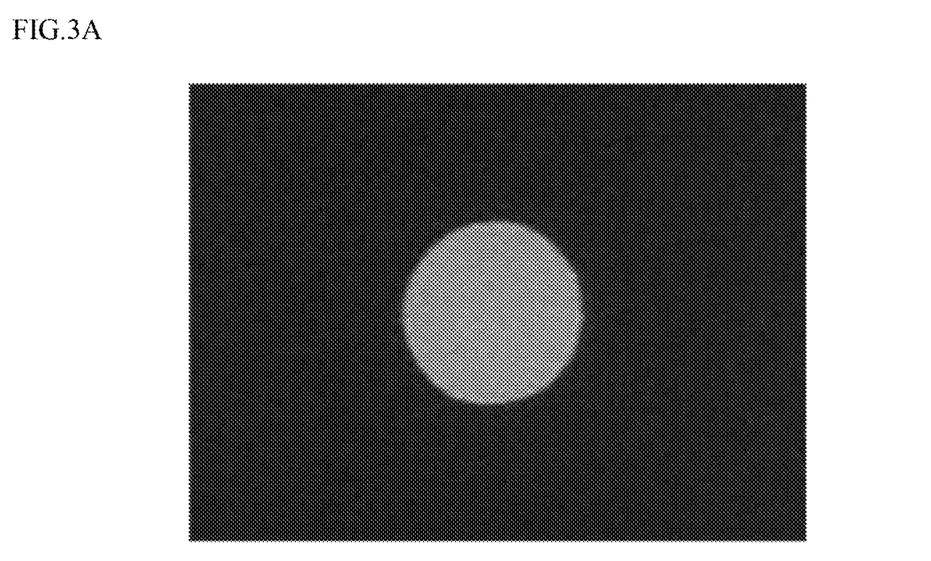
Figure 3B:
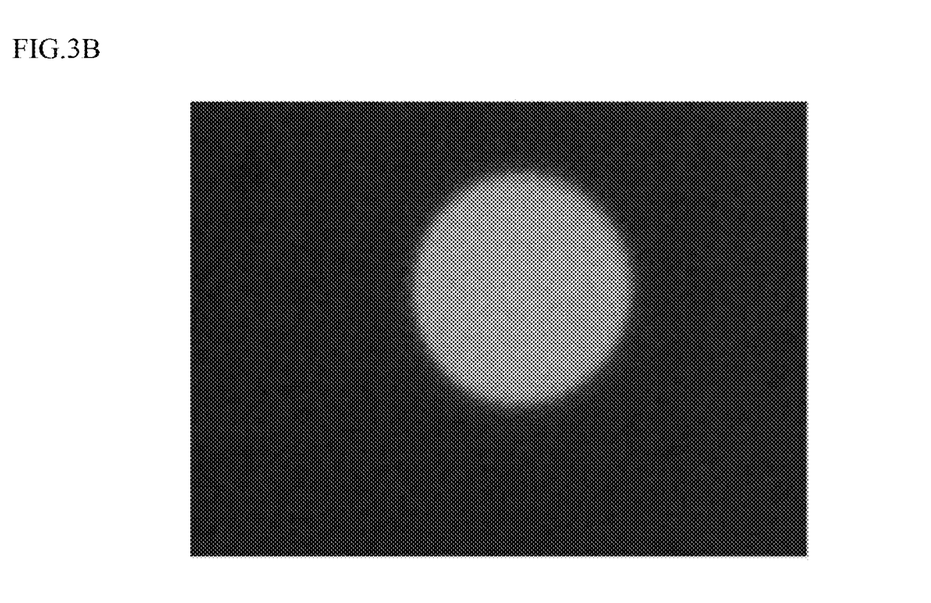

FIG. 1 is a plan view of a polarizer according to one embodiment of the present invention. A polarizer 1 includes a resin film containing a dichroic substance. The polarizer (resin film) 1 has formed therein a low concentration portion 2 having a relatively low content of the dichroic substance. Specifically, the polarizer 1 has formed therein the low concentration portion 2 having a content of the dichroic substance lower than that of another portion 3. The low concentration portion can function as a non-polarizing portion. With such construction, a problem in terms of quality, such as cracking, delamination (interlayer peeling), or adhesive protrusion, is avoided as compared to the case where a through-hole is formed mechanically (e.g., by a method involving mechanically punching out the through-hole in the polarizer through the use of, for example, chisel punching, a plotter, or a water jet). In addition, the content of the dichroic substance itself of the low concentration portion is low, and hence the transparency of the non-polarizing portion is satisfactorily maintained as compared to the case where the non-polarizing portion is formed by the decomposition of the dichroic substance with laser light or the like.

In the illustrated example, the low concentration portion 2 of a small circular shape is formed at a central portion in the upper end portion of the polarizer 1, but the number, arrangement, shape, size, and the like of the low concentration portion can be appropriately designed. The design is performed in accordance with, for example, the position, shape, and size of the camera portion of an image display apparatus on which the polarizer is mounted. Specifically, the design is performed so that the low concentration portion may not correspond to the position except the camera (e.g., image display portion) of the image display apparatus on which the polarizer is mounted.

The transmittance of the low concentration portion (e.g., a transmittance measured with light having a wavelength of 550 nm at 23° C.) is preferably 50% or more, more preferably 60% or more, still more preferably 75% or more, particularly preferably 90% or more. With such transmittance, desired transparency can be secured. For example, when the low concentration portion is caused to correspond to the camera portion of an image display apparatus, an adverse effect on the photographing performance of the camera can be prevented.

The polarizer (except the low concentration portion) preferably shows absorption dichroism in the wavelength range of from 380 nm to 780 nm. The single axis transmittance (Ts) of the polarizer (except the low concentration portion) is preferably 39% or more, more preferably 39.5% or more, still more preferably 40% or more, particularly preferably 40.5% or more. A theoretical upper limit for the single axis transmittance is 50%, and a practical upper limit therefor is 46%. In addition, the single axis transmittance (Ts) is a Y value measured with the two-degree field of view (C light source) of JIS Z 8701 and subjected to visibility correction, and can be measured with, for example, a microspectroscopic system (manufactured by Lambda Vision Inc., LVmicro). The polarization degree of the polarizer (except the low concentration portion) is preferably 99.8% or more, more preferably 99.9% or more, still more preferably 99.95% or more.

The thickness of the polarizer (resin film) may be set to any appropriate value. The thickness is typically 0.5 μm or more and 80 μm or less, preferably 30 μm or less, more preferably 25 μm or less, still more preferably 18 μm or less, particularly preferably 12 μm or less, more particularly preferably less than 8 μm. The lower limit value of the thickness is preferably 1 μm or more. As the thickness becomes smaller, the low concentration portion can be more satisfactorily formed. For example, when a basic solution to be described later is brought into contact with the resin film, the low concentration portion can be formed in a shorter time period. In addition, the thickness of the portion with which the basic solution is brought into contact may be smaller than that of another portion. When the thickness of the resin film is small, a difference in thickness between the portion brought into contact with the basic solution and another portion can be reduced, and hence the bonding of the polarizer to any other constituent member, such as a protective film, can be satisfactorily performed.

Examples of the dichroic substance include iodine and an organic dye. The substances may be used alone or in combination. Of those, iodine is preferably used. This is because the low concentration portion can be satisfactorily formed by contact with a basic solution to be described later.

The low concentration portion is a portion whose content of the dichroic substance is lower than that of another portion. The content of the dichroic substance of the low concentration portion is preferably 1.0 wt % or less, more preferably 0.5 wt % or less, still more preferably 0.2 wt % or less. When the content of the dichroic substance of the low concentration portion falls within such range, desired transparency can be sufficiently imparted to the low concentration portion. For example, when the low concentration portion is caused to correspond to the camera portion of an image display apparatus, photographing performance extremely excellent from both the viewpoints of brightness and a tint can be achieved. Meanwhile, a lower limit value for the content of the dichroic substance of the low concentration portion is typically equal to or less than a detection limit. When iodine is used as the dichroic substance, an iodine content is determined from, for example, a calibration curve produced in advance from an X-ray intensity measured by fluorescent X-ray analysis through the use of a standard sample.

A difference between the content of the dichroic substance in another portion and the content of the dichroic substance in the low concentration portion is preferably 0.5 wt % or more, more preferably 1 wt % or more. When the difference between the contents falls within such range, a low concentration portion having desired transparency can be formed.

The content of an alkali metal and/or an alkaline earth metal in the low concentration portion is 3.6 wt % or less, preferably 2.5 wt % or less, more preferably 1.0 wt % or less, still more preferably 0.5 wt % or less. When the content of the alkali metal and/or the alkaline earth metal in the low concentration portion falls within such range, the shape of the low concentration portion formed by contact with a basic solution to be described later can be satisfactorily maintained (i.e., a low concentration portion having excellent dimensional stability can be achieved). The content can be determined from, for example, a calibration curve produced in advance from an X-ray intensity measured by fluorescent X-ray analysis through the use of a standard sample. Such content can be achieved by reducing the content of the alkali metal and/or the alkaline earth metal in a contact portion in the contact with the basic solution to be described later.

Any appropriate resin may be used as a resin for forming the resin film. A polyvinyl alcohol-based resin (hereinafter referred to as "PVA-based resin") is preferably used as the resin. Examples of the PVA-based resin include polyvinyl alcohol and an ethylene-vinyl alcohol copolymer. The polyvinyl alcohol is obtained by saponifying polyvinyl acetate. The ethylene-vinyl alcohol copolymer is obtained by saponifying an ethylene-vinyl acetate copolymer. The saponification degree of the PVA-based resin is typically 85 mol % or more and less than 100 mol %, preferably from 95.0 mol % to 99.95 mol %, more preferably from 99.0 mol % to 99.93 mol %. The saponification degree may be determined in conformity with JIS K 6726-1994. The use of the PVA-based resin having such saponification degree can provide a polarizer excellent in durability. When the saponification degree is too high, there is a risk of gelation.

The average polymerization degree of the PVA-based resin may be appropriately selected depending on purposes. The average polymerization degree is typically from 1,000 to 10,000, preferably from 1, 200 to 4, 500, more preferably from 1, 500 to 4, 300. The average polymerization degree may be determined in conformity with JIS K 6726-1994.

B. Method of Producing Polarizer

The low concentration portion can be formed by bringing a basic solution into contact with the resin film containing the dichroic substance. Further, such content of the alkali metal and/or the alkaline earth metal as described above in the low concentration portion can be achieved by reducing the content of the alkali metal and/or the alkaline earth metal in a contact portion with the basic solution. Therefore, a method of producing the polarizer of the present invention includes: bringing the basic solution into contact with the resin film containing the dichroic substance; and reducing the content of the alkali metal and/or the alkaline earth metal in the contact portion.

B-1. Contact of Basic Solution

As described above, the low concentration portion is formed by bringing the basic solution into contact with the resin film containing the dichroic substance. When iodine is used as the dichroic substance, the contact of the basic solution with a desired portion of the resin film can easily reduce the iodine content of the contact portion. Specifically, the contact can cause the basic solution to permeate into the resin film. An iodine complex in the resin film is reduced by a base in the basic solution to become an iodine ion. The reduction of the iodine complex to the iodine ion can increase the transmittance of the contact portion. Then, iodine that has become the iodine ion moves from the resin film into the solvent of the basic solution. The transparency of the low concentration portion thus obtained can be satisfactorily maintained. Specifically, when the transmittance is increased by breaking the iodine complex, iodine remaining in the resin film may form the iodine complex again in association with the use of the polarizer to reduce the transmittance, but when the iodine content is reduced, such problem is prevented.

Any appropriate method may be adopted as a method of bringing the basic solution into contact with the resin film. Examples thereof include: a method involving dropping, applying, or spraying the basic solution onto the resin film; and a method involving immersing the resin film in the basic solution.

At the time of the contact of the basic solution, the resin film may be protected with any appropriate protective material so that the basic solution may not be brought into contact with a portion except a desired portion (the concentration of the dichroic substance may not reduce). Specific examples of the protective material for the resin film include a protective film and a surface protective film. Some of the protective films may each be utilized as it is as a protective film for the polarizer. The surface protective film is temporarily used at the time of the production of the polarizer. The surface protective film is typically bonded to the resin film through intermediation of a pressure-sensitive adhesive layer because the film is removed from the resin film at any appropriate timing. Another specific example of the protective material is a photoresist.

Any appropriate basic compound may be used as the basic compound. Examples of the basic compound include: hydroxides of alkali metals, such as sodium hydroxide, potassium hydroxide, and lithium hydroxide; hydroxides of alkaline earth metals, such as calcium hydroxide; inorganic alkali metal salts, such as sodium carbonate; organic alkali metal salts, such as sodium acetate; and ammonia water. Of those, hydroxides of alkali metals and/or alkaline earth metals are preferably used, and sodium hydroxide, potassium hydroxide, and lithium hydroxide are more preferably used. The dichroic substance can be efficiently ionized, and hence the low concentration portion can be formed more easily. Those basic compounds may be used alone or in combination.

Any appropriate solvent may be used as the solvent of the basic solution. Specific examples thereof include water, alcohols, such as ethanol and methanol, ethers, benzene, chloroform, and mixed solvents thereof. Of those, water or an alcohol is preferably used because the ionized dichroic substance can satisfactorily migrate to the solvent.

The concentration of the basic solution is, for example, from 0.01 N to 5 N, preferably from 0.05 N to 3 N, more preferably from 0.1 N to 2.5 N. When the concentration falls within such range, a desired low concentration portion can be satisfactorily formed.

The liquid temperature of the basic solution is, for example, from 20° C. to 50° C. The time period for which the resin film and the basic solution are brought into contact with each other can be set in accordance with the thickness of the resin film, the kind of the basic compound, and the concentration of the basic solution, and is, for example, from 5 seconds to 30 minutes.

In one embodiment, at the time of the contact of the basic solution, the surface of the resin film is covered with a surface protective film so that at least part thereof may be exposed. The polarizer of the illustrated example is produced by, for example, bonding a surface protective film having formed therein a through-hole having a small circular shape to the resin film, and bringing the basic solution into contact with the resultant. At that time, the other side of the resin film (the side on which the surface protective film is not arranged) is also preferably protected. When the resin film has an elongated shape, the lamination of the resin film and the protective material is preferably performed by a roll-to-roll process. The term "roll-to-roll" as used herein means that roll-shaped films are laminated with their longitudinal directions aligned with each other while being conveyed. Through-holes are formed in the elongated surface protective film in, for example, the lengthwise direction and/or widthwise direction thereof at a predetermined interval.

The thickness of the surface protective film is typically from 20 μm to 250 μm, preferably from 30 μm to 150 μm. The surface protective film is preferably a film having a high hardness (e.g., modulus of elasticity). This is because the deformation of the through-holes can be prevented. As materials for forming the surface protective film, there are given, for example: an ester-based resin, such as a polyethylene terephthalate-based resin; a cycloolefin-based resin, such as a norbornene-based resin; an olefin-based resin, such as polypropylene; a polyamide-based resin; a polycarbonate-based resin; and a copolymer resin thereof. Of those, an ester-based resin (in particular, a polyethylene terephthalate-based resin) is preferred.

When the basic solution is brought into contact with the resin film, the resin film is preferably brought into a state in which the film can be used as a polarizer. Specifically, the film is preferably subjected to various treatments, such as a swelling treatment, a stretching treatment, a dyeing treatment with the dichroic substance, a cross-linking treatment, a washing treatment, and a drying treatment. When the resin film is subjected to the various treatments, the resin film may be a resin layer formed on a substrate. A laminate of the substrate and the resin layer can be obtained by, for example, a method involving applying an application liquid containing a material for forming the resin film to the substrate, or a method involving laminating the resin film on the substrate.

The dyeing treatment is typically performed by causing the dichroic substance to adsorb to the resin film. A method for the adsorption is, for example, a method involving immersing the resin film in a dyeing liquid containing the dichroic substance, a method involving applying the dyeing liquid to the resin film, or a method involving spraying the dyeing liquid on the resin film. Of those, the method involving immersing the resin film in the dyeing liquid is preferred. This is because the dichroic substance can satisfactorily adsorb thereto.

When iodine is used as the dichroic substance, an aqueous solution of iodine is preferably used as the dyeing liquid. The compounding amount of iodine is preferably from 0.04 part by weight to 5.0 parts by weight with respect to 100 parts by weight of water. The aqueous solution of iodine is preferably compounded with an iodide in order that the solubility of iodine in water may be increased. Potassium iodide is preferably used as the iodide. The compounding amount of the iodide is preferably from 0.3 part by weight to 15 parts by weight with respect to 100 parts by weight of water.

In the stretching treatment, typically, the resin film is uniaxially stretched at from 3 times to 7 times. A stretching direction can correspond to the absorption axis direction of the polarizer to be obtained.

Boric acid may be incorporated into the resin film by the various treatments. For example, when a boric acid solution (e.g., an aqueous solution of boric acid) is brought into contact with the resin film at the time of the stretching treatment or the cross-linking treatment, boric acid may be incorporated into the resin film. The boric acid content of the resin film is, for example, from 10 wt % to 30 wt %. In addition, a boric acid content in the contact portion with the basic solution is, for example, from 5 wt % to 12 wt %.

B-2. Reduction of Content of Alkali Metal and/or Alkaline Earth Metal

After the contact with the basic solution, the content of an alkali metal and/or an alkaline earth metal in the resin film is reduced in a contact portion with which the basic solution has been brought into contact. The reduction in content of the alkali metal and/or the alkaline earth metal can provide a low concentration portion excellent in dimensional stability. Specifically, the shape of the low concentration portion formed by the contact with the basic solution can be maintained as it is even under a humidified environment.

When the basic solution is brought into contact with the resin film, a hydroxide of the alkali metal and/or the alkaline earth metal may remain in the contact portion. In addition, when the basic solution is brought into contact with the resin film, a metal salt of the alkali metal and/or the alkaline earth metal may be produced in the contact portion. Any such metal salt may produce a hydroxide ion, and the produced hydroxide ion may act on (decompose or reduce) the dichroic substance (e.g., an iodine complex) present around the contact portion to expand a non-polarizing region (low concentration region). Therefore, it is assumed that the reduction in content of the alkali metal salt and/or the alkaline earth metal salt suppresses temporal expansion of the non-polarizing region and hence enables the maintenance of a desired shape of the non-polarizing portion.

The metal salt that may produce a hydroxide ion is, for example, a borate. The borate may be produced by the neutralization of boric acid in the resin film with the basic solution (a solution of a hydroxide of an alkali metal and/or a hydroxide of an alkaline earth metal). For example, when the polarizer is placed under a humidified environment, the borate (metaborate) may be hydrolyzed to produce a hydroxide ion as represented by the following formulae.

(In the formulae, X represents an alkali metal or an alkaline earth metal).

In the method of producing the polarizer of the present invention, the content of the alkali metal and/or the alkaline earth metal in the contact portion is reduced so that the content may be 3.6 wt % or less, preferably 2.5 wt % or less, more preferably 1.0 wt % or less, still more preferably 0.5 wt % or less.

The alkali metal and/or the alkaline earth metal may be incorporated into the resin film in advance by subjecting the film to the various treatments for turning the film into a polarizer. For example, potassium may be incorporated into the resin film by bringing a solution of an iodide, such as potassium iodide, into contact with the film. The alkali metal and/or the alkaline earth metal to be typically incorporated into the polarizer as described above may not adversely affect the dimensional stability of the low concentration portion.

A method involving bringing a treatment liquid into contact with the contact portion with the basic solution is preferably used as the method for the reduction. According to such method, the alkali metal and/or the alkaline earth metal is caused to migrate from the resin film toward the treatment liquid, and hence the content thereof can be reduced.

Any appropriate method may be adopted as a method for the contact of the treatment liquid. Examples thereof include: a method involving dropping, applying, or spraying the treatment liquid onto the contact portion with the basic solution; and a method involving immersing the contact portion with the basic solution in the treatment liquid.

In the case where the resin film is protected with any appropriate protective material at the time of the contact of the basic solution, the treatment liquid is preferably brought into contact as it is with the contact portion (particularly when the temperature of the treatment liquid is 50° C. or more). According to such mode, reductions in polarization characteristics by the treatment liquid can be prevented in a portion except the contact portion with the basic solution.

The treatment liquid may contain any appropriate solvent. Examples of the solvent include water, alcohols, such as ethanol and methanol, ethers, benzene, chloroform, and mixed solvents thereof. Of those, water or an alcohol is preferably used from the viewpoint of efficiently causing the alkali metal and/or the alkaline earth metal to migrate. Any appropriate water may be used as the water. Examples thereof include tap water, pure water, and deionized water.

The temperature of the treatment liquid at the time of its contact is, for example, 20° C. or more, preferably 50° C. or more, more preferably 60° C. or more, still more preferably 70° C. or more. With such temperature, the alkali metal and/or the alkaline earth metal can be efficiently caused to migrate toward the treatment liquid. Specifically, the swelling ratio of the resin film is significantly increased, and hence the alkali metal and/or the alkaline earth metal in the resin film can be physically removed. Meanwhile, the temperature of the water is substantially 95° C. or less.

A contact time may be appropriately adjusted in accordance with, for example, the contact method, the temperature of the treatment liquid (water), and the thickness of the resin film. For example, when the resin film is immersed in warm water, the contact time is preferably from 10 seconds to 30 minutes, more preferably from 30 seconds to 15 minutes, still more preferably from 60 seconds to 10 minutes.

In one embodiment, an acidic solution is used as the treatment liquid. The use of the acidic solution can neutralize the hydroxide of the alkali metal and/or the alkaline earth metal remaining in the resin film to chemically remove the alkali metal and/or the alkaline earth metal in the resin film.

Any appropriate acidic compound may be used as an acidic compound in the acidic solution. Examples of the acidic compound include: inorganic acids, such as hydrochloric acid, sulfuric acid, nitric acid, hydrogen fluoride, and boric acid; and organic acids, such as formic acid, oxalic acid, citric acid, acetic acid, and benzoic acid. The acidic compound in the acidic solution is preferably an inorganic acid, more preferably hydrochloric acid, sulfuric acid, or nitric acid. One kind of those acidic compounds may be used alone, or two or more kinds thereof may be used in combination.

An acidic compound having an acidity stronger than that of boric acid is preferably used as the acidic compound. This is because the compound can also act on the metal salt (borate) of the alkali metal and/or the alkaline earth metal. Specifically, the compound can liberate boric acid from any such borate to chemically remove the alkali metal and/or the alkaline earth metal in the resin film.

An indicator of the acidity is, for example, an acid dissociation constant (pKa), and an acidic compound having a pKa smaller than the pKa of boric acid (9.2) is preferably used. Specifically, the pKa is preferably less than 9.2, more preferably 5 or less. The pKa may be measured with any appropriate measuring apparatus, and reference may be made to a value disclosed in a literature, such as "Handbook of Chemistry: Pure Chemistry, 5th ed." (edited by The Chemical Society of Japan, Maruzen Publishing Co., Ltd.). In addition, in the case of an acidic compound that dissociates in a multi-stages, its pKa value may change in each stage. When such acidic compound is used, such a compound that any one of the pKa values in the respective stages falls within the range is used. The pKa as used herein refers to a value in an aqueous solution at 25° C.

A difference between the pKa of the acidic compound and the pKa of boric acid is, for example, 2.0 or more, preferably from 2.5 to 15, more preferably from 2.5 to 13. When the difference falls within such range, the alkali metal and/or the alkaline earth metal can be efficiently caused to migrate toward the treatment liquid, and as a result, a desired content of the alkali metal and/or the alkaline earth metal in the low concentration portion can be achieved.

Examples of the acidic compound that may satisfy the pKa include inorganic acids, such as hydrochloric acid (pKa: −3.7), sulfuric acid ($pK_2$: 1.96), nitric acid (pKa: −1.8), hydrogen fluoride (pKa: 3.17), and boric acid (pKa: 9.2), and organic acids, such as formic acid (pKa: 3.54), oxalic acid ($pK_1$: 1.04, $pK_2$: 3.82), citric acid ($pK_1$: 3.09, $pK_2$: 4.75, $pK_3$: 6.41), acetic acid (pKa: 4.8), and benzoic acid (pKa: 4.0).

The solvent of the acidic solution (treatment liquid) is as described above, and also in this mode in which the acidic solution is used as the treatment liquid, the physical removal of the alkali metal and/or the alkaline earth metal in the resin film may occur.

The concentration of the acidic solution is, for example, from 0.01 N to 5 N, preferably from 0.05 N to 3 N, more preferably from 0.1 N to 2.5 N.

The liquid temperature of the acidic solution is, for example, from 20° C. to 50° C. The time period for which the resin film and the acidic solution are brought into contact with each other can be set in accordance with the thickness of the resin film, the kind of the acidic compound, and the concentration of the acidic solution, and is, for example, from 5 seconds to 30 minutes.

The polarizer of the present invention can be obtained by subjecting the resin film containing the dichroic substance to those treatments. The resin film may be further subjected to any appropriate other treatment in addition to the treatments. Examples of the other treatment include the removal of the basic solution and/or the acidic solution, and washing.

A method for the removal of the basic solution and/or the acidic solution is specifically, for example, removal by wiping with a waste cloth or the like, removal by suction, natural drying, heat drying, blow drying, or vacuum drying. The drying temperature is, for example, from 20° C. to 100° C.

The washing treatment is performed by any appropriate method. Examples of a solution to be used in the washing treatment include pure water, alcohols, such as methanol and ethanol, an acidic aqueous solution, and mixed solvents thereof. The washing treatment may be performed in any appropriate stage. The washing treatment may be performed a plurality of times.

B. Polarizing Plate

A polarizing plate of the present invention includes the polarizer. The polarizing plate of the present invention is typically used under a state in which a protective film is laminated on at least one side thereof. As materials for forming the protective film, there are given, for example, a cellulose-based resin, such as diacetyl cellulose or triacetyl cellulose, a (meth)acrylic resin, a cycloolefin-based resin, an olefin-based resin, such as polypropylene, an ester-based resin, such as a polyethylene terephthalate-based resin, a polyamide-based resin, a polycarbonate-based resin, and copolymer resins thereof.

The surface of the protective film on which the polarizer is not laminated may have formed thereon a hard coat layer as a surface-treated layer, or may be subjected surface treatment such as an antireflection treatment or a treatment intended for diffusion or for antiglare.

The thickness of the protective film is preferably from 10 μm to 100 μm. The protective film is typically laminated on the polarizer through intermediation of an adhesion layer (specifically an adhesive layer or a pressure-sensitive adhesive layer). The adhesive layer is typically formed of a PVA-based adhesive or an active energy ray-curable adhesive. The pressure-sensitive adhesive layer is typically formed of an acrylic pressure-sensitive adhesive.

C. Image Display Apparatus

An image display apparatus of the present invention includes the polarizing plate. Examples of the image display apparatus include a liquid crystal display apparatus and an organic EL device. Specifically, the liquid crystal display apparatus includes a liquid crystal panel including: a liquid crystal cell; and the polarizer arranged on one side, or each of both sides, of the liquid crystal cell. The organic EL device includes an organic EL panel including the polarizer arranged on a viewer side. The polarizer is arranged so that its low concentration portion may correspond to the camera portion of an image display apparatus on which the polarizer is mounted.

EXAMPLES

Example 1

An amorphous isophthalic acid-copolymerized polyethylene terephthalate (IPA-copolymerized PET) film of an elongated shape (thickness: 100 μm) having a coefficient of water absorption of 0.75% and a Tg of 75° C. was used as a substrate. One surface of the substrate was subjected to a corona treatment, and an aqueous solution containing polyvinyl alcohol (polymerization degree: 4,200, saponification degree: 99.2 mol %) and acetoacetyl-modified PVA (polymerization degree: 1,200, acetoacetyl modification degree: 4.6%, saponification degree: 99.0 mol % or more, manufactured by The Nippon Synthetic Chemical Industry Co., Ltd., trade name: "GOHSEFIMER Z-200") at a ratio of 9:1 was applied to the corona-treated surface and dried at 25° C. to form a PVA-based resin layer having a thickness of 11 μm. Thus, a laminate was produced.

The resultant laminate was subjected to free-end uniaxial stretching in an oven at 120° C. between rolls having different peripheral speeds in a longitudinal direction (lengthwise direction) at 2.0 times (in-air auxiliary stretching).

Next, the laminate was immersed in an insolubilizing bath having a liquid temperature of 30° C. (an aqueous solution of boric acid obtained by compounding 100 parts by weight of water with 4 parts by weight of boric acid) for 30 seconds (insolubilizing treatment).

Next, the laminate was immersed in a dyeing bath having a liquid temperature of 30° C. while an iodine concentration and an immersion time were adjusted so that a polarizing plate to be obtained had a predetermined transmittance. In this example, the laminate was immersed in an aqueous solution of iodine, which was obtained by compounding 100 parts by weight of water with 0.2 part by weight of iodine and 1.5 parts by weight of potassium iodide, for 60 seconds (dyeing treatment).

Next, the laminate was immersed in a cross-linking bath having a liquid temperature of 30° C. (an aqueous solution of boric acid obtained by compounding 100 parts by weight of water with 3 parts by weight of potassium iodide and 3 parts by weight of boric acid) for 30 seconds (cross-linking treatment).

After that, the laminate was subjected to uniaxial stretching between rolls having different peripheral speeds in a longitudinal direction (lengthwise direction) so that a total stretching ratio became 5.5 times while being immersed in an aqueous solution of boric acid having a liquid temperature of 70° C. (an aqueous solution obtained by compounding 100 parts by weight of water with 4 parts by weight of boric acid and 5 parts by weight of potassium iodide) (underwater stretching).

After that, the laminate was immersed in a washing bath having a liquid temperature of 30° C. (an aqueous solution obtained by compounding 100 parts by weight of water with 4 parts by weight of potassium iodide) (washing treatment).

Subsequently, a PVA-based resin aqueous solution (manufactured by The Nippon Synthetic Chemical Industry Co., Ltd., trade name: "GOHSEFIMER (trademark) Z-200", resin concentration: 3 wt %) was applied to the PVA-based resin layer surface of the laminate, and a protective film (thickness: 25 μm) was bonded thereto, followed by the heating of the resultant in an oven maintained at 60° C. for 5 minutes. After that, the substrate was peeled from the PVA-based resin layer. Thus, a polarizing plate (polarizer (transmittance: 42.3%, thickness: 5 μm)/protective film) was obtained.

An aqueous solution of sodium hydroxide at normal temperature (1.0 mol/L (1.0 N)) was dropped to the surface of the polarizing plate having a total thickness of 30 μm obtained in the foregoing on a polarizer side so as to have a diameter of 4 mm, and the resultant was left to stand for 60 seconds. After that, the dropped aqueous solution of sodium hydroxide was removed with a waste cloth.

Next, hydrochloric acid at normal temperature (1.0 mol/L (1.0 N)) was dropped to the contact portion with the aqueous solution of sodium hydroxide, and the resultant was left to stand for 30 seconds. After that, the dropped hydrochloric acid was removed with a waste cloth. Thus, a transparent portion was formed in the polarizer.

Example 2

A transparent portion was formed in the polarizer in the same manner as in Example 1 except that the concentration of the hydrochloric acid was changed to 0.1 mol/L (0.1 N).

Example 3

A pressure-sensitive adhesive (acrylic pressure-sensitive adhesive) was applied to one surface of an ester-based film (thickness: 38 μm) so as to have a thickness of 10 μm. A through-hole having a diameter of 4 mm was formed in the ester-based film with the pressure-sensitive adhesive with a pinnacle blade.

The ester-based film was bonded to the polarizer side of the polarizing plate having a total thickness of 30 μm used in Example 1 through intermediation of the pressure-sensitive adhesive layer. Thus, a polarizing film laminate was obtained.

An aqueous solution of sodium hydroxide at normal temperature (1.0 mol/L (1.0 N)) was dropped to a portion where the polarizer was exposed from the ester-based film of the resultant polarizing film laminate, and the resultant was left to stand for 60 seconds. After that, the dropped aqueous solution of sodium hydroxide was removed with a waste cloth.

Next, the polarizing film laminate was immersed in a water bath set to 55° C. for 60 seconds. After the immersion, water adhering to its surface was removed with a waste cloth, and then the ester-based film was peeled. Thus, a transparent portion was formed in the polarizer.

Example 4

A transparent portion was formed in the polarizer in the same manner as in Example 3 except that the temperature of the water bath was changed to 70° C.

Example 5

A transparent portion was formed in the polarizer in the same manner as in Example 3 except that: the temperature of the water bath was changed to 40° C.; and after the removal of the water with the waste cloth, hydrochloric acid (1.0 mol/L (1.0 N)) was dropped to the portion where the polarizer was exposed, and the resultant was left to stand for 30 seconds, followed by the removal of the hydrochloric acid with a waste cloth.

Example 6

A transparent portion was formed in the polarizer in the same manner as in Example 5 except that the temperature of the water bath was changed to 70° C.

Example 7

A transparent portion was formed in the polarizer in the same manner as in Example 3 except that the temperature of the water bath was changed to 30° C.

Example 8

A transparent portion was formed in the polarizer in the same manner as in Example 3 except that the temperature of the water bath was changed to 40° C.

Comparative Example 1

An attempt was made to form a transparent portion in the same manner as in Example 1 except that: pure water was used instead of the aqueous solution of sodium hydroxide; and the hydrochloric acid was not brought into contact with the contact portion.

Comparative Example 2

A transparent portion was formed in the polarizer in the same manner as in Example 1 except that the hydrochloric acid was not brought into contact with the contact portion.

Each of the polarizing plates of Examples and Comparative Examples was evaluated for the following items. The results of the evaluations are summarized in Table 1.

1. Transmittance (Ts)

Measurement was performed with a spectrophotometer (manufactured by Murakami Color Research Laboratory, product name: "DOT-3"). A transmittance (T) is a Y value subjected to visibility correction with the two-degree field of view (C light source) of JIS Z 8701-1982.

2. Iodine Content

An iodine content in the contact portion of a polarizer was determined by fluorescent X-ray analysis. Specifically, the iodine content of the polarizer was determined from a calibration curve produced in advance from the X-ray intensity measured under the following conditions through the use of a standard sample.

Analysis apparatus: manufactured by Rigaku Corporation, X-ray fluorescence (XRF) analysis apparatus, product name "ZSX100e"
Anticathode: rhodium
Dispersive crystal: lithium fluoride
Excitation light energy: 40 kV-90 mA
Iodine measured line: I-LA
Quantification method: FP method
2θ angle peak: 103.078 deg (iodine)
Measurement time: 40 seconds 3. Sodium Content A sodium content in the contact portion of a polarizer was determined by fluorescent X-ray analysis. Specifically, the sodium content of the polarizer was determined from a calibration curve produced in advance from an X-ray intensity measured under the following conditions through the use of a standard sample.

Analysis apparatus: manufactured by Rigaku Corporation, X-ray fluorescence (XRF) analysis apparatus, product name "ZSX100e"
Anticathode: rhodium
Dispersive crystal: lithium fluoride
Excitation light energy: 40 kV-90 mA
Sodium measured line: Na-KA
Quantification method: FP method
Measurement time: 40 seconds 4. Sodium Reduction Ratio The aqueous solution of sodium hydroxide that had been brought into contact with a polarizer was removed with a waste cloth, and the sodium content of the contact portion immediately after the contact was measured. After that, the sodium content of the contact portion (transparent portion) of the finally obtained polarizer was measured. A reduction ratio was calculated from the following equation by using those measured values.

$$\text{Reduction ratio} = ((\text{sodium content of contact portion immediately after contact}) - (\text{sodium content of contact portion (transparent portion) of resultant polarizer})) / (\text{sodium content of contact portion immediately after contact}) \times 100$$

5. Size Change Ratio

Each of the resultant polarizing plates was placed under a 65° C./90% RH environment for 500 hours. The sizes of its transparent portion before and after a humidity test were measured, and a size change ratio was calculated by using the following equation.

After the humidity test, edge detection was performed with a super-high-speed flexible image processing system (manufactured by Keyence Corporation, trade name: "XG-7500") to draw a boundary line between the transparent portion and another portion, and the size of a portion having the maximum size was measured.

$$\text{Size change ratio (\%)} = 100 \times (\text{size of transparent portion after humidity test}) / (\text{size of transparent portion before humidity test})$$

TABLE 1

| | Treatment liquid | | Transmittance | Iodine content | Sodium content | Sodium reduction | Size change |
| --- | --- | --- | --- | --- | --- | --- | --- |
| | Kind | Temperature | (%) | (wt %) | (wt %) | ratio (%) | ratio (%) |
| Example 1 | Hydrochloric acid | Normal temperature | 93.5 | 0.12 | 0.04 | 99 | 100.5 |
| Example 2 | Hydrochloric acid | Normal temperature | 93.4 | 0.1 | 0.04 | 99 | 100.6 |
| Example 3 | Water | 55° C. | 93.7 | 0.14 | 0.61 | 85 | 104.8 |
| Example 4 | Water | 70° C. | 93.4 | 0.1 | 0.13 | 97 | 101.2 |
| Example 5 | Water Hydrochloric acid | 40° C. Normal temperature | 93.1 | 0.1 | 0.04 | 99 | 100.2 |
| Example 6 | Water Hydrochloric acid | 70° C. Normal temperature | 93.2 | 0.1 | 0.04 | 99 | 100.4 |
| Example 7 | Water | 30° C. | 93.1 | 0.13 | 3.53 | 12 | 125.5 |
| Example 8 | Water | 40° C. | 93.3 | 0.11 | 2.29 | 43 | 122.3 |
| Comparative Example 1 | — | — | 42.3 | 5.1 | 0.03 | — | — |
| Comparative Example 2 | — | — | 93.3 | 0.11 | 4.0 | — | 130.3 |

In each of Examples and Comparative Example 2, the iodine content in the transparent portion was low and hence the portion was regarded as a low iodine concentration portion. In each of Examples, the size of the transparent portion was maintained as compared to Comparative Example 2. As illustrated in FIGS. 2A, 2B, 3A and 3B, high dimensional stability was observed in each of Examples 1 to 6.

INDUSTRIAL APPLICABILITY

The polarizer of the present invention is suitably used in an image display apparatus (a liquid crystal display apparatus or an organic EL device) with a camera of, for example, a cellular phone, such as a smart phone, a notebook PC, or a tablet PC.

CITATION LIST 1 polarizer (resin film)
2 low concentration portion

The invention claimed is:

1. A method of producing a polarizer, comprising:
bringing a basic solution into contact with a resin film containing a dichroic substance; and
reducing, in a contact portion, a content of an alkali metal and/or an alkaline earth metal in the resin film,
wherein the reducing a content of an alkali metal salt and/or an alkaline earth metal salt is performed by bringing a treatment liquid into contact with the contact portion,
the treatment liquid is selected from the group consisting of hydrochloric acid, sulfuric acid, nitric acid, water having a temperature of 50° C. or more, and a combination of water having a temperature of 40° C. or more with hydrochloric acid, sulfuric acid or nitric acid.

2. The production method according to claim 1, wherein the reducing a content of an alkali metal and/or an alkaline earth metal in the contact portion is performed so that the content may be 3.6 wt % or less.

3. The production method according to claim 1, wherein the treatment liquid contains water.

4. The production method according to claim 1, wherein the treatment liquid contain water and has a temperature of 55° C. or more and 95° C. or less.

5. The production method according to claim 1, wherein the treatment liquid is hydrochloric acid, sulfuric acid or nitric acid.

6. The production method according to claim 5, wherein the resin film contains boric acid.

7. The production method according to claim 1, wherein the reducing the content of the alkali metal salt and/or the alkaline earth metal salt is performed by bringing a first treatment liquid into contact with the contact portion, and a second treatment liquid into contact with the contact portion, wherein the first treatment liquid is different to the second treatment liquid.

8. The production method according to claim 7, wherein the first treatment liquid into contact with the contact portion and the second treatment liquid into contact with the contact portion are independently selected from the group consisting of hydrochloric acid, sulfuric acid, nitric acid, water having a temperature of 50° C. or more, and a combination of water having a temperature of 40° C. or more with hydrochloric acid, sulfuric acid or nitric acid.

* * * * *